United States Patent
Chen et al.

(10) Patent No.: US 10,629,270 B2
(45) Date of Patent: Apr. 21, 2020

(54) MEMORY CIRCUIT HAVING PSEUDO GROUND

(71) Applicant: RICHTEK TECHNOLOGY CORPORATION, Zhubei, Hsinchu (TW)

(72) Inventors: Isaac Y. Chen, Hsinchu (TW); Yin-Chang Chen, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/285,140

(22) Filed: Feb. 25, 2019

(65) Prior Publication Data
US 2019/0378577 A1 Dec. 12, 2019

(30) Foreign Application Priority Data

Jun. 11, 2018 (CN) .......................... 2018 1 0596916

(51) Int. Cl.
*G11C 16/04* (2006.01)
*G11C 16/30* (2006.01)
*G11C 17/04* (2006.01)
*G11C 16/10* (2006.01)

(52) U.S. Cl.
CPC .......... *G11C 16/30* (2013.01); *G11C 16/0408* (2013.01); *G11C 16/10* (2013.01); *G11C 17/04* (2013.01)

(58) Field of Classification Search
CPC ............ G11C 11/4076; G11C 11/4097; G11C 13/0007; G11C 13/004; G11C 13/0064; G11C 13/0069; G11C 13/0073; G11C 13/083; G11C 13/009; G11C 13/0092
See application file for complete search history.

(56) References Cited

U.S. PATENT DOCUMENTS

2007/0036017 A1 * 2/2007 Seo ........................ G11C 11/406
365/222

* cited by examiner

*Primary Examiner* — Thong Q Le
(74) *Attorney, Agent, or Firm* — Tung & Associates

(57) ABSTRACT

A memory circuit includes a memory unit, a memory control circuit and a pseudo ground voltage generation circuit. The memory control circuit includes: a level shifter circuit coupled to a variable supply voltage; a driver circuit coupled to the pseudo ground voltage generation circuit at the pseudo ground node. The driver circuit is powered by the variable supply voltage and generates an access signal according to the driving signal, to access data from the memory unit. Under a high-voltage operation, the variable supply voltage provides a first supply voltage level, so that a high level of the access signal corresponds to the first supply voltage level and the pseudo ground voltage generation circuit provides a pseudo ground voltage level at the pseudo ground node. A voltage difference between the first supply voltage level and the pseudo ground voltage level is smaller than a withstand voltage of the driver circuit.

14 Claims, 7 Drawing Sheets

MEMORY CIRCUIT HAVING PSEUDO GROUND

CROSS REFERENCE

The present invention claims priority to CN 201810596916.6, filed on Jun. 11, 2018.

BACKGROUND OF THE INVENTION

Field of Invention

The present invention relates to a memory circuit. In particular, the present invention relates to such memory circuit having pseudo ground.

Description of Related Art

Please refer to FIG. 1, which shows a schematic block diagram of a conventional memory circuit (i.e., memory circuit 1). The memory circuit 1 is configured to operably perform a high-voltage operation or a low-voltage operation to access data. Under the high-voltage operation, the variable supply voltage Vpp provides a high voltage level of for example but not limited to 10V. A driver circuit 22 is powered by the variable supply voltage Vpp (which is 10V in this case), to generate an access signal (for example but not limited to the "WL" shown in FIG. 1). The high-voltage operation for example corresponds to a programming operation (i.e., writing data) into the memory unit 10. On the other hand, under a low-voltage operation, the variable supply voltage Vpp provides a low voltage level of for example but not limited to 5V. The driver circuit 22 is powered by the variable supply voltage Vpp (which is 5V in this case), to generate the access signal WL. The low-voltage operation for example corresponds to a read operation for reading out data from the memory unit 10.

The prior art shown in FIG. 1 has a drawback, in that: if the driver circuit 22 is composed of low-voltage devices, the high voltage level of the variable supply voltage Vpp will be limited by the withstand voltage of the low-voltage devices in the driver circuit 22, thereby leading to a longer programming period or a poor reliability of writing data. On the other hand, if the high voltage level of the variable supply voltage Vpp is raised in order to shorten the programming period or improve the reliability of writing data, the driver circuit 22 has to be made of high-voltage devices, which will increase the production cost.

In view of the above, the present invention provides a memory circuit which is more advantageous than the prior art in that: the driver circuit 22 can be composed of low-voltage devices, while at the same time the high voltage level of the variable supply voltage Vpp can be raised, so that the present invention can effectively shorten the programming period and improve the reliability of writing data, without increasing the production cost.

SUMMARY OF THE INVENTION

From one perspective, the present invention provides a memory circuit, which is configured to operably perform a high-voltage operation or a low-voltage operation to access data, the memory circuit comprising: a memory unit, which is configured to operably store the data; a memory control circuit, which is configured to operably control the memory unit; and a pseudo ground voltage generation circuit coupled to the memory control circuit, wherein the memory control circuit and the pseudo ground voltage generation circuit are commonly coupled to a pseudo ground node; wherein the memory control circuit includes: a level shifter circuit coupled to a variable supply voltage, the level shifter circuit being configured to operably generate a driving signal according to a first address signal; and a driver circuit coupled to the level shifter circuit, the pseudo ground node and the memory unit, wherein the driver circuit is powered by the variable supply voltage and generates an access signal according to the driving signal, to perform the high-voltage operation or the low-voltage operation on the memory unit; wherein, under the high-voltage operation, the variable supply voltage provides a first supply voltage level, so that a high level of the access signal corresponds to the first supply voltage level, and wherein, under the high-voltage operation, the pseudo ground voltage generation circuit provides a pseudo ground voltage level at the pseudo ground node, wherein a voltage difference between the first supply voltage level and the pseudo ground voltage level is smaller than a withstand voltage of the driver circuit; wherein, under the low-voltage operation, the variable supply voltage provides a second supply voltage level, so that the high level of the access signal corresponds to the second supply voltage level, and wherein, under the low-voltage operation, the pseudo ground voltage generation circuit electrically connects the pseudo ground node to a common ground voltage level.

In one embodiment, the memory unit performs the high-voltage operation according to a voltage difference between the first supply voltage level and the common ground voltage level.

In one embodiment, a voltage difference between the first supply voltage level and the common ground voltage level is greater than the withstand voltage.

In one embodiment, a voltage difference between the second supply voltage level and the common ground voltage level is smaller than the withstand voltage.

In one embodiment, the memory circuit further comprises: a programming switch, which is configured to, under the high-voltage operation, operably provide a programming ground voltage level to the memory unit, for performing the high-voltage operation.

In one embodiment, the memory circuit writes the data into the memory unit in the high-voltage operation.

In one embodiment, the driver circuit includes a pull-up switch, which is configured to operably conduct the variable supply voltage according to the driving signal, to provide the high level of the access signal.

In one embodiment, the driver circuit includes a pull-down switch, which is configured to operably conduct the pseudo ground node according to the driving signal, to provide the low level of the access signal.

In one embodiment, the level shifter is further coupled to the pseudo ground node, and wherein the level shifter generates the driving signal further according to a voltage level of the pseudo ground node.

In one embodiment, the pseudo ground voltage generation circuit includes: a reference voltage circuit, which is configured to operably provide the pseudo ground voltage level under the high-voltage operation; and a ground switch, which is configured to operably conduct the common ground voltage level to the pseudo ground node under the low-voltage operation, the ground switch being OFF under the high-voltage operation.

In one embodiment, the reference voltage circuit includes an amplifier circuit, which is configured to operably regulate the pseudo ground voltage level according to a difference between a reference signal and a pseudo-ground-related signal, wherein the pseudo-ground-related signal is related to the pseudo ground voltage level.

In one embodiment, the reference voltage circuit includes at least one diode and a current source, for providing the pseudo ground voltage level, wherein the current source provides a direct current to the at least one diode, and wherein the pseudo ground voltage level is determined by a forward voltage of the at least one diode and/or a reverse breakdown voltage of the at least one diode.

In one embodiment, the memory unit includes a non-volatile memory device.

In one embodiment, the non-volatile memory device is a floating gate flash storage device or a one time programmable (OTP) storage device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
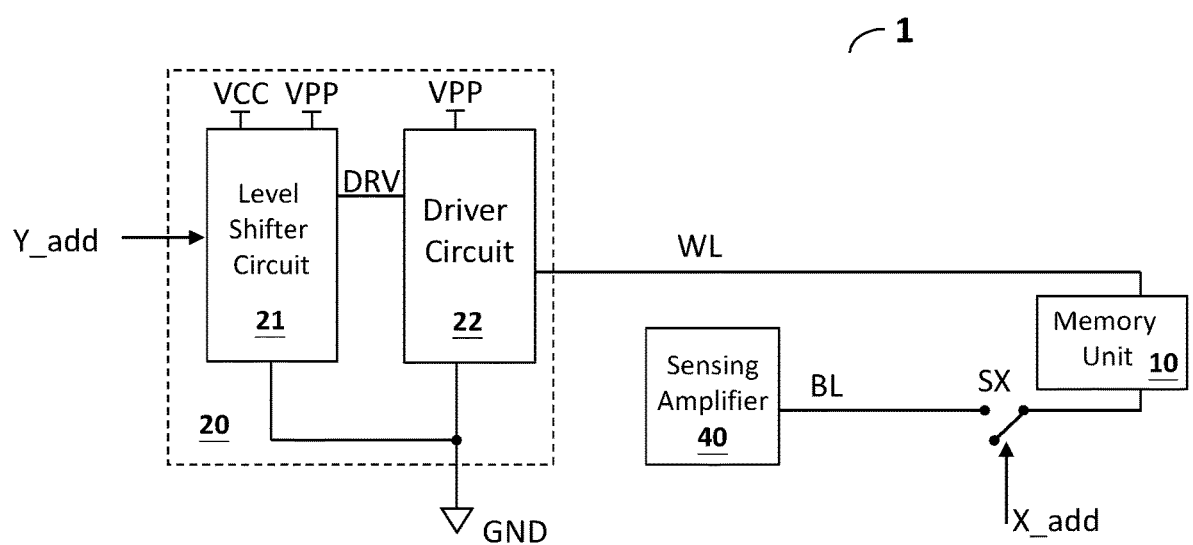
FIG. 1 shows a schematic block diagram of a conventional memory circuit.
Figure 2A:
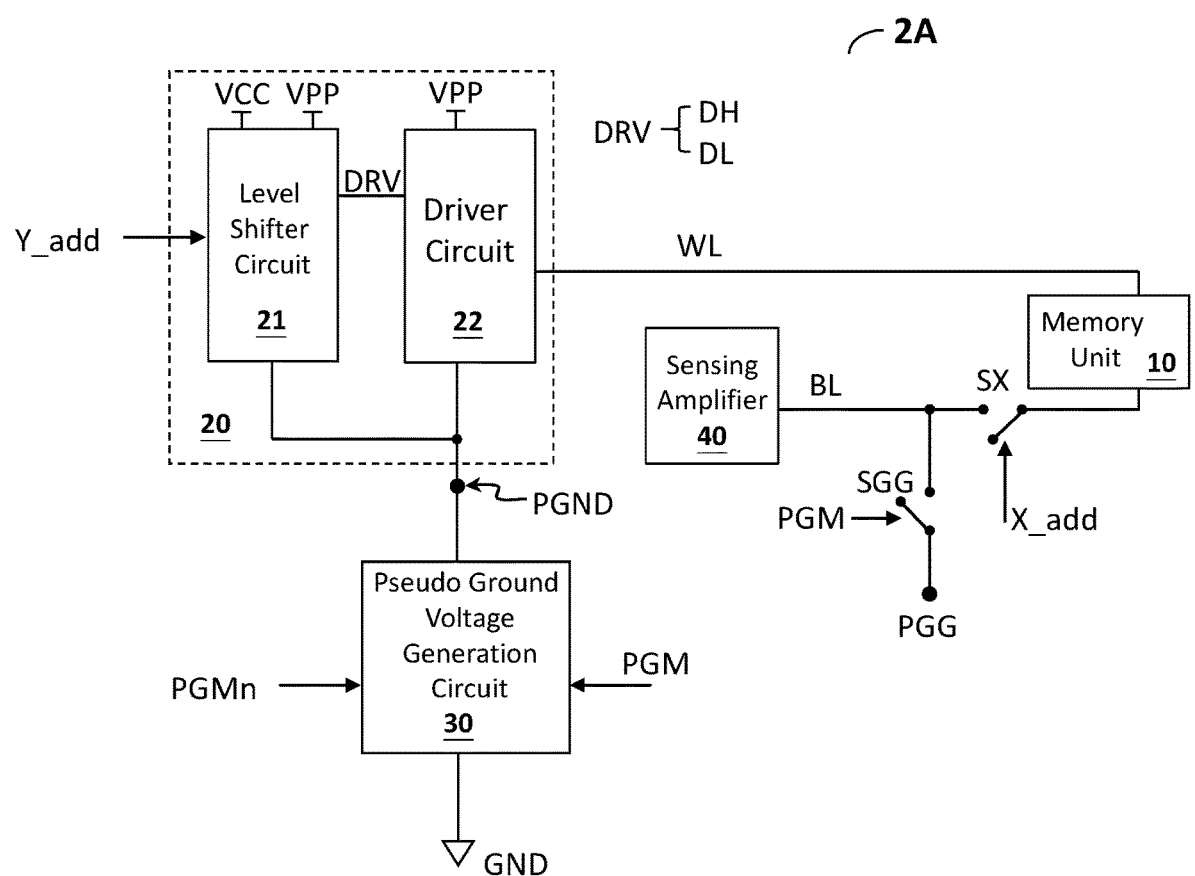
FIG. 2A shows a schematic block diagram of a memory circuit having pseudo ground according to an embodiment of the present invention.

Please refer to FIG. 2A, which shows a schematic block diagram of a memory circuit (i.e., memory circuit 2A) having pseudo ground according to an embodiment of the present invention. The memory circuit 2A comprises: a memory unit 10, a memory control circuit 20 and a pseudo ground voltage generation circuit 30. The memory circuit 2A is configured to operably perform a high-voltage operation or a low-voltage operation on the memory unit 10, so as to access data in the memory unit 10. The memory control circuit 20 is coupled to the memory unit 10. The pseudo ground voltage generation circuit 30 and the memory control circuit 20 are commonly coupled to a pseudo ground node PGND.

Please still refer to FIG. 2A. The memory control circuit 20 includes a level shifter circuit 21 and a driver circuit 22. The level shifter circuit 21 is coupled to a variable supply voltage Vpp, and the level shifter circuit 21 is configured to operably generate a driving signal (for example but not limited to DRV as shown in FIG. 2A) according to a first address signal Y add. In one embodiment, the level shifter circuit 21 is also coupled to an operation voltage VCC, and is configured to operably convert the first address signal Y add whose reference level is the operation voltage VCC to the driving signal DRV whose reference level is the variable supply voltage Vpp. The driver circuit 22 is coupled to the level shifter circuit 21, the pseudo ground node PGND and the memory unit 10. The driver circuit 22 is powered by the variable supply voltage Vpp and generates an access signal WL according to the driving signal DRV, to perform the high-voltage operation or the low-voltage operation on the memory unit 10. In one embodiment, the high-voltage operation for example corresponds to a programming operation into the memory unit 10 (i.e., writing data into the memory unit 10), whereas, the low-voltage operation for example corresponds to a read operation to read out data from the memory unit 10. In one embodiment, the level shifter 21 is further coupled to the pseudo ground node PGND, and the level shifter 21 generates the driving signal DRV further according to a voltage level of the pseudo ground node PGND.

Figure 3:
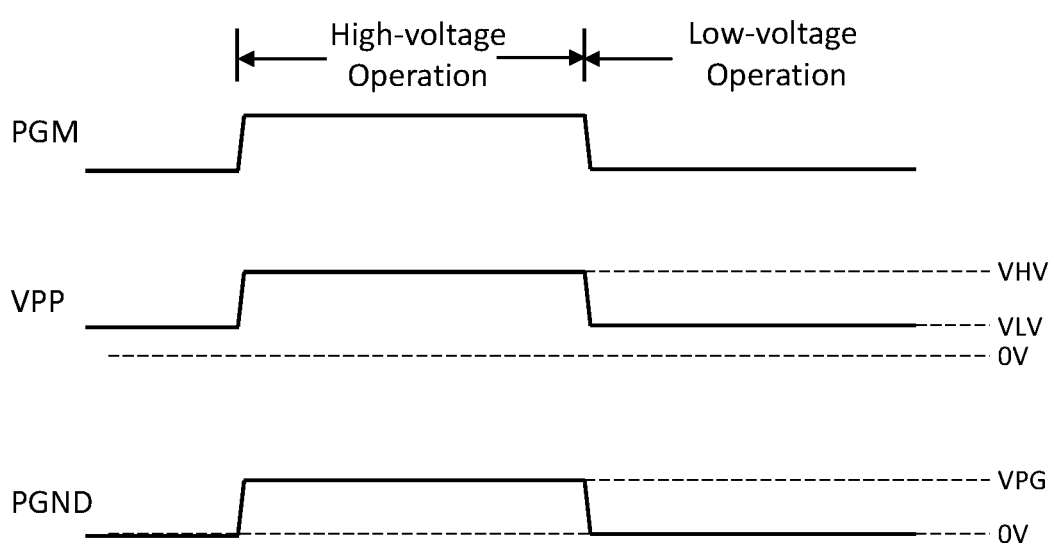
FIG. 3 shows waveforms corresponding to a memory circuit having pseudo ground of the present invention.

Please refer to FIG. 2A in conjugation with FIG. 3. FIG. 3 shows waveforms corresponding to a memory circuit having pseudo ground in accordance with the present invention. Under the high-voltage operation (e.g., corresponding to a circumstance where a programming signal PGM is at a high level), the variable supply voltage Vpp provides a first supply voltage level VHV (for example but not limited to 17V), so that the high level of the access signal WL corresponds to the first supply voltage level VHV. That is, the memory unit 10 can be programmed by a voltage as high as, e.g. 17V (which is, with reference to the common ground voltage level GND). And, under such high-voltage operation, the pseudo ground voltage generation circuit 30 provides a pseudo ground voltage level VPG (for example but not limited to 9V) at the pseudo ground node PGND. The voltage difference (i.e., 17V−9V=8V) between the first supply voltage level VHV and the pseudo ground voltage level VPG is smaller than a withstand voltage VWS (for example but not limited to 10V) of the driver circuit 22. In this embodiment, under the high-voltage operation, because the actual operation voltage for the driver circuit 22 is the voltage difference (i.e., 8V) between the variable supply voltage Vpp (which is VHV, e.g., 17V) and the pseudo ground voltage level VPG (e.g., 9V), according to the present invention, the driver circuit 22 can be made of devices having a low withstand voltage (e.g., 10V), to reduce the production cost.

On the other hand, under the low-voltage operation (e.g., corresponding to a circumstance where the programming signal PGM is at a low level), the variable supply voltage Vpp provides a second supply voltage level VLV (for example but not limited to 5V), so that the high level of the access signal WL corresponds to the second supply voltage level VLV. Moreover, under the low-voltage operation, the pseudo ground voltage generation circuit 30 electrically connects the pseudo ground node PGND to the common ground voltage level GND (i.e., 0V). In this embodiment, under the low-voltage operation, because the actual operation voltage for the driver circuit 22 is the voltage difference (i.e., 5V) between the variable supply voltage Vpp (which is VLV, e.g., 5V) and the common ground voltage level GND (e.g., 5V), the data reading operation and other operations under the low-voltage operation can be performed by low power consumption.

Please still refer to FIG. 2A. In one embodiment, the memory circuit 2A further comprises a sensing amplifier circuit 40, which is configured to, under the low-voltage operation, operably sense the state of a bit stored in the memory unit 10 according to a second address signal X_add, for reading out data.

Figure 2B:
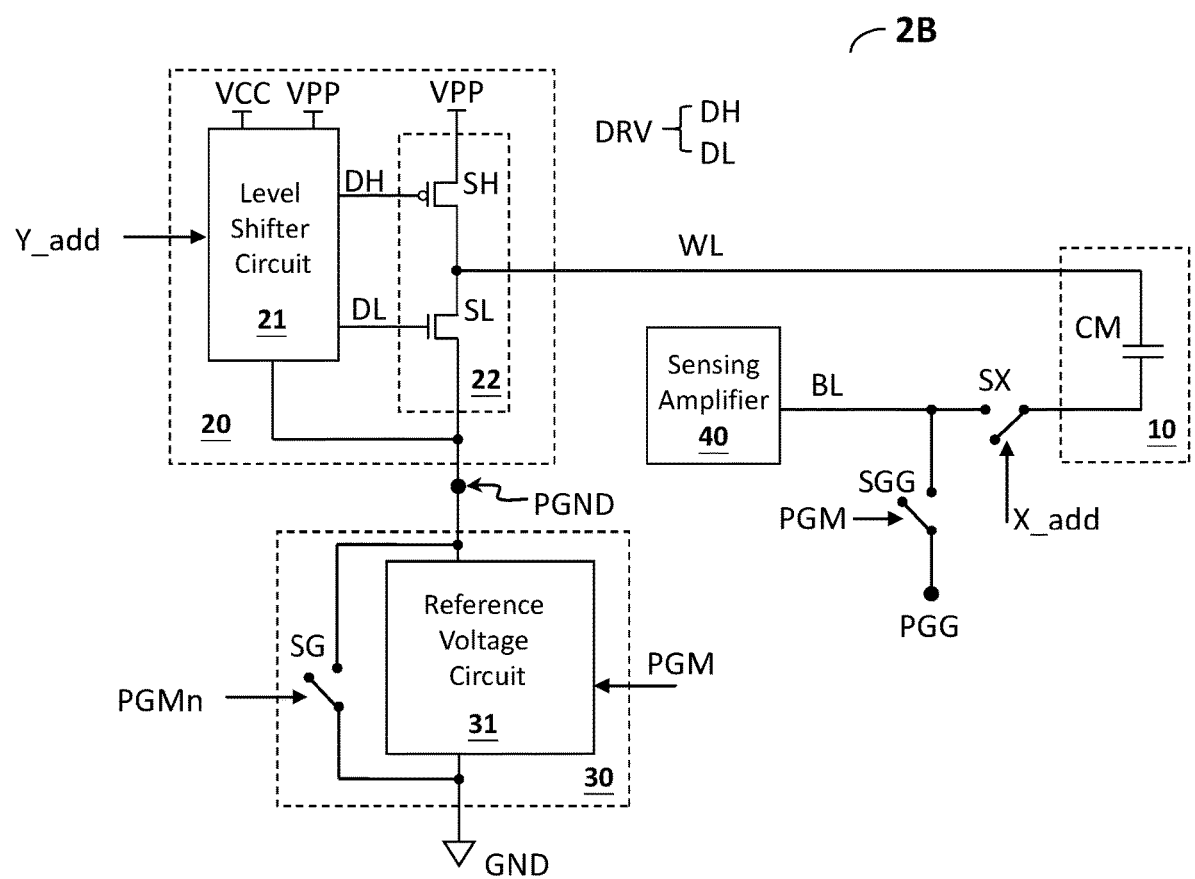
FIG. 2B shows a schematic block diagram of a memory circuit having pseudo ground according to a specific embodiment of the present invention.

Please refer to FIG. 2B, which shows a schematic block diagram of a specific embodiment of the memory unit 10, the memory control circuit 20 and the pseudo ground voltage generation circuit 30 included in the memory circuit 2B of the present invention. In one embodiment, the memory unit 10 includes a non-volatile memory device. In one embodiment, the non-volatile memory device can be, for example but not limited to, a floating gate flash storage device or a one time programmable (OTP) storage device. In another embodiment, the memory unit 10 can be a capacitor type OTP storage device. For example, in the embodiment where the memory unit 10 is a capacitor type OTP storage device, the equivalent circuit of the memory unit 10 can be represented by a capacitor CM shown in FIG. 2B; in this case, in one embodiment, when it is intended to program the memory unit 10 (corresponding to the above-mentioned high-voltage operation), the dielectric layer of the capacitor CM can be shot-through by an access signal WL having a voltage level of e.g. 17V, to change the capacitance or resistance of the capacitor CM, thereby writing data into the memory unit 10. On the other hand, when it is intended to read out data from the memory unit 10 (corresponding to the above-mentioned low-voltage operation), the sensing amplifier circuit 40 senses the capacitance or resistance of the capacitor CM to obtain a level of the data stored in the memory unit 10. For another example, in the embodiment where the memory unit 10 is a floating gate flash storage device, charges can be stored into a floating gate thereof by an access signal WL having a high voltage level (e.g., 17V), to write data into the memory unit 10.

Because the memory circuit of the present invention can reduce the voltage that the driver circuit 22 is required to withstand under a high-voltage operation by the pseudo ground node PGND, the high level of the variable supply voltage Vpp can be raised, whereby an access signal WL having a relatively high voltage level can be employed to program the memory unit 10. As a result, the programming period is shorter, for example, to shoot-through the above-mentioned capacitor type OTP storage device, and the reliability of data writing is better ensured. Besides, because it does not need to manufacture the driver circuit 22 with high-voltage devices, the production cost can be reduced.

Please still refer to FIG. 2B. In one embodiment, the memory circuit 2B further comprises: a programming switch SGG. The programming switch SGG is configured to, under the high-voltage operation, operably provide a voltage difference between the first supply voltage level VHV and a programming ground voltage level PGG to the memory unit 10, for the high-voltage operation. In one embodiment, the programming switch SGG is coupled between a bit line and the programming ground voltage level PGG, and is controlled by a programming signal PGM. In one embodiment, the programming ground voltage level PGG can be directly electrically connected to the common ground voltage level GND. In this embodiment, the memory unit 10 can perform the high-voltage operation according to the voltage difference between the first supply voltage level VHV and the common ground voltage level GND; that is, when it is intended to program the memory unit 10 (corresponding to the above-mentioned high-voltage operation), the memory unit 10 is programmed (such as by the above-mentioned shoot-through operation) according to the voltage difference between the first supply voltage level VHV and the common ground voltage level GND. In another embodiment, the programming ground voltage level PGG can be a negative voltage, to further raise the voltage for programming the memory unit 10. Besides, as shown in FIG. 2B, a switch SX is controlled by the second address signal X_add; the second address signal X_add and the above-mentioned first address signal Y_add are decoded together, so as to write date into or read data out from a specific address of the memory unit 10.

Note that, in one embodiment according to the present invention, the voltage difference (e.g., 17V) between the first supply voltage level VHV and the common ground voltage level GND is greater than the withstand voltage VWS (e.g., 10V); in other words, according to the present invention, the first supply voltage level VHV is not limited by the withstand voltage VWS of the driver circuit 22, but can be higher than the withstand voltage VWS, for achieving better high-voltage operation. And, the voltage difference (e.g., 5V) between the second supply voltage level VLV (e.g., 5V) of the variable supply voltage Vpp and the common ground voltage level GND is smaller than the withstand voltage VWS (e.g., 10V), whereby the power consumption in low-voltage operation is reduced.

Please still refer to FIG. 2B. In one embodiment, the level shifter 21 is further coupled to the pseudo ground node PGND. The level shifter 21 generates the driving signal DRV further according to a voltage level of the pseudo ground node PGND. In this embodiment, the driving signal DRV includes a driving signal DH and a driving signal DL (the details as to how these signals operate will be explain later).

Please still refer to FIG. 2B, which shows an embodiment of the driver circuit (i.e., driver circuit 22) of the present invention. In one embodiment, the driver circuit 22 includes a pull-up switch SH (for example but not limited to a PMOS switch); the pull-up switch SH is configured to operably conduct the variable supply voltage Vpp according to the driving signal DH, to provide the high level of the access signal WL. And in one embodiment, the driver circuit 22 includes a pull-down switch SL (for example but not limited to an NMOS switch). The pull-down switch SL is configured to operably conduct the pseudo ground node PGND according to the driving signal DL, to provide the low level of the access signal WL. Note that, in the present invention, under the high-voltage operation, the low level of the access signal WL is the pseudo ground voltage level VPG, whereas, under the low-voltage operation, the low level of the access signal WL is the common ground voltage level GND.

Please still refer to FIG. 2B. In one embodiment, the pseudo ground voltage generation circuit 30 includes: a reference voltage circuit 31 and a ground switch SG. The reference voltage circuit 31 is configured to operably provide the above-mentioned pseudo ground voltage level VPG under the high-voltage operation, while at the same time, the ground switch SG is OFF. In addition, the ground switch SG is configured to operably conduct the common ground voltage level GND to the pseudo ground node PGND under the low-voltage operation. Such operation can be achieved by, for example but not limited to, controlling the ground switch SG via a programming signal PGMn, wherein the programming signal PGMn can be, for example but not limited to, a complementary signal of the programming signal PGM. In one embodiment, the reference voltage circuit 31 is controlled by the programming signal PGM; that is, the reference voltage circuit 31 determines whether to generate the pseudo ground voltage level VPG according to the programming signal PGM.

Figure 4:
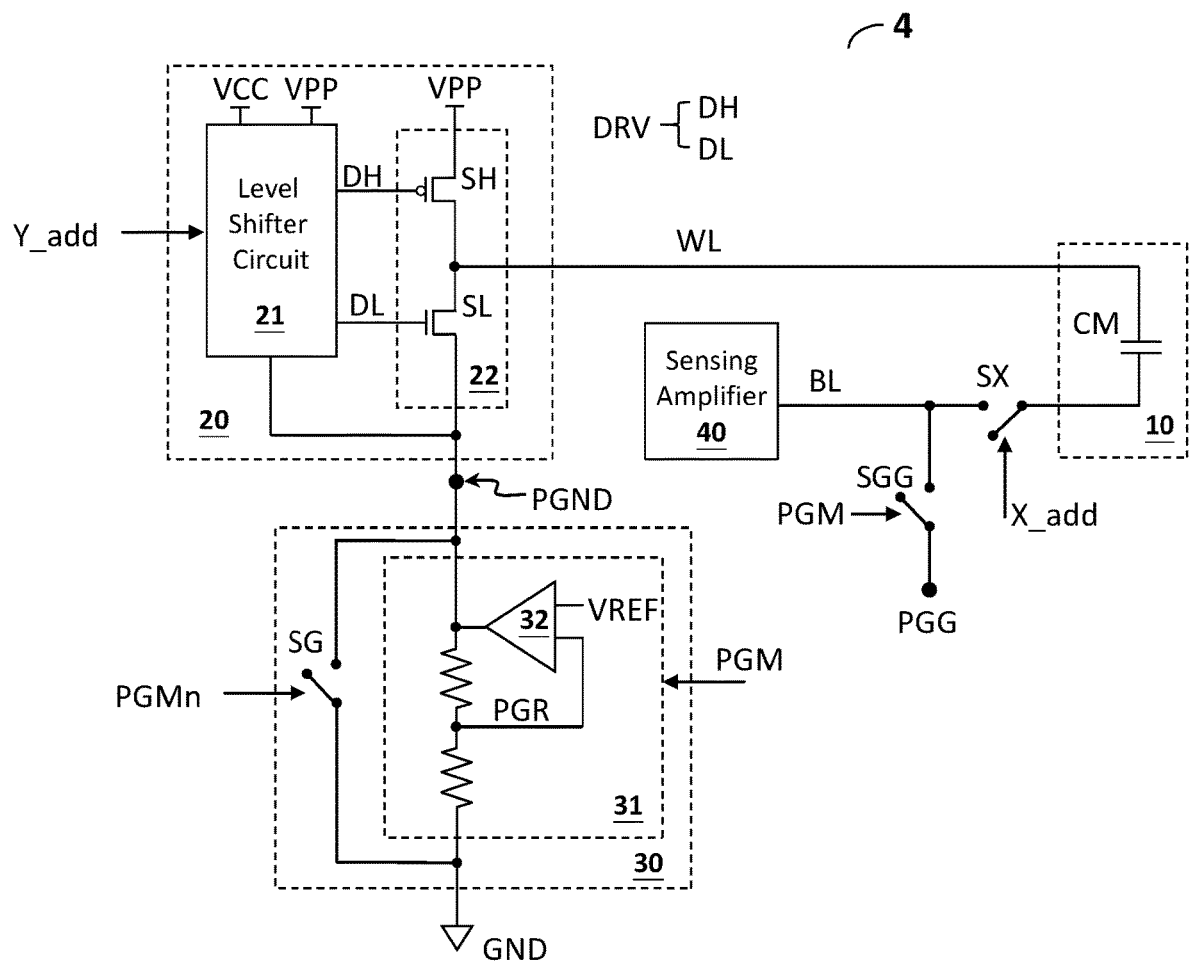
FIG. 4 shows a specific embodiment of a pseudo ground voltage generation circuit of the present invention.

Please refer to FIG. 4, which shows an embodiment of a reference voltage circuit (i.e., reference voltage circuit 31) of the present invention. The reference voltage circuit 31 includes an amplifier circuit 32. The amplifier circuit 32 is configured to operably regulate the pseudo ground voltage level VPG according to a difference between a reference signal VREF and a pseudo-ground-related signal PGR. Under the high-voltage operation, the pseudo-ground-related signal PGR is related to the pseudo ground voltage level VPG. As shown in FIG. 4, in one embodiment, the pseudo-ground-related signal PGR can be, for example but not limited to, a divided voltage of the pseudo ground voltage level VPG. In another embodiment, the pseudo-ground-related signal PGR can be directly electrically connected to the pseudo ground voltage level VPG.

Figure 5A:
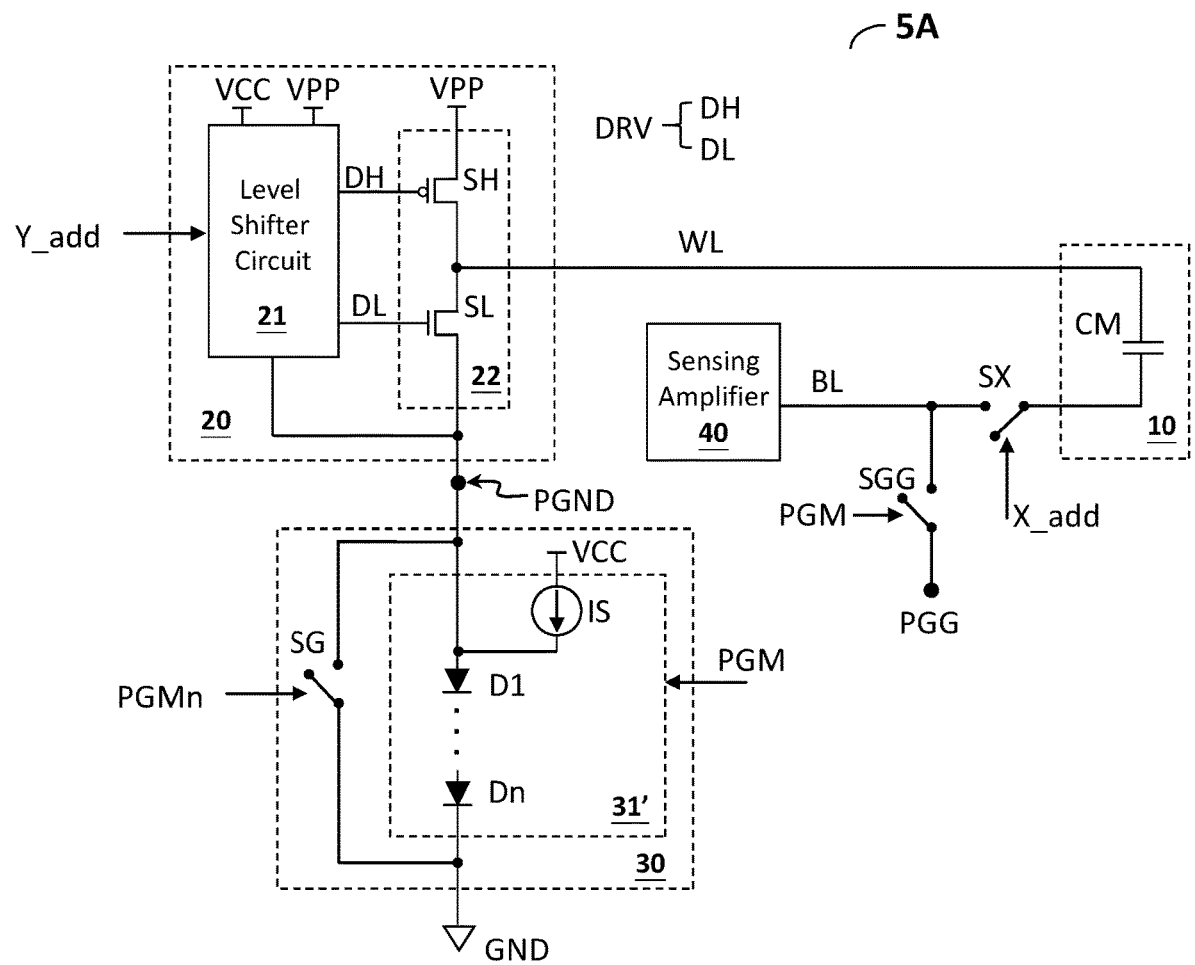
FIG. 5A-5B show two other specific embodiments of a pseudo ground voltage generation circuit of the present invention.
Figure 5B:
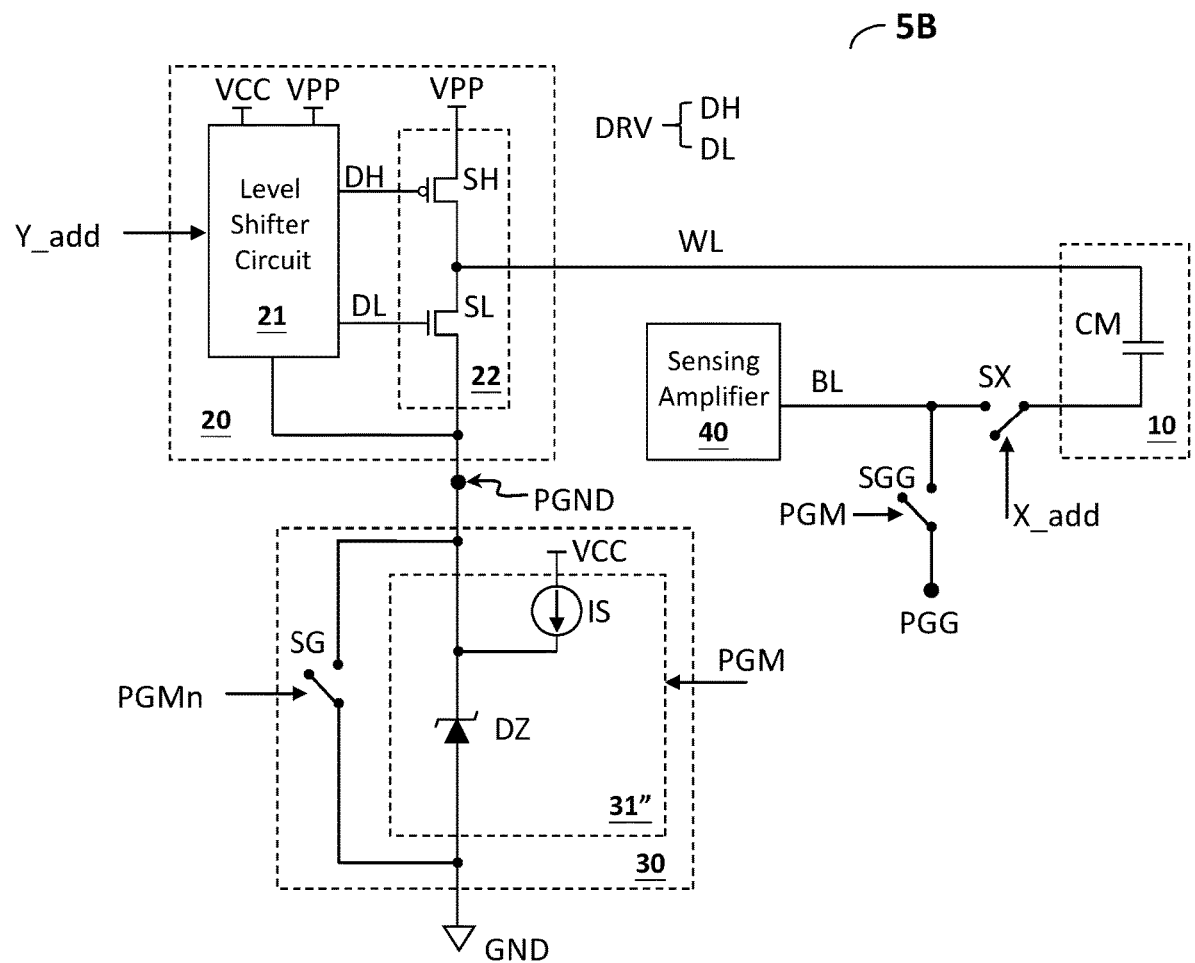

Please refer to FIG. 5A, which shows another embodiment of a reference voltage circuit (i.e., reference voltage circuit 31') of the present invention. The reference voltage circuit 31' for example includes at least one diode and a current source IS. As shown in the figure, in this embodiment, plural diodes D1-Dn are connected in series (as shown in FIG. 5A), wherein n denotes a natural number. The current source IS provides a direct current to the abovementioned diodes D1-Dn. Under the high-voltage operation, the pseudo ground voltage level VPG is determined by a forward voltage of the at least one diode and/or a reverse breakdown voltage of the at least one diode. For example, as shown in FIG. 5A, in the reference voltage circuit 31', the pseudo ground voltage level VPG is determined by a sum of the forward voltages of the diodes D1-Dn. In another embodiment, as shown in FIG. 5B, a reference voltage circuit 31" can include, for example but not limited to, a Zener diode (as shown by DZ in FIG. 5B). Under such situation, in the reference voltage circuit 31", the pseudo ground voltage level VPG is determined by the reverse breakdown voltage of the Zener diode DZ.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, there can be more than one memory unit; under such circumstance, the memory circuit can include a corresponding number of memory control circuits in correspondence with the memory units. For another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A memory circuit, which is configured to operably perform a high-voltage operation or a low-voltage operation to access data, the memory circuit comprising:
   a memory unit, which is configured to operably store the data;
   a memory control circuit, which is configured to operably control the memory unit; and
   a pseudo ground voltage generation circuit coupled to the memory control circuit, wherein the memory control circuit and the pseudo ground voltage generation circuit are commonly coupled to a pseudo ground node;
   wherein the memory control circuit includes:
      a level shifter circuit coupled to a variable supply voltage, the level shifter circuit being configured to operably generate a driving signal according to a first address signal; and
      a driver circuit coupled to the level shifter circuit, the pseudo ground node and the memory unit, wherein the driver circuit is powered by the variable supply voltage and generates an access signal according to the driving signal, to perform the high-voltage operation or the low-voltage operation on the memory unit;
   wherein, under the high-voltage operation, the variable supply voltage provides a first supply voltage level, so that a high level of the access signal corresponds to the first supply voltage level, and wherein, under the high-voltage operation, the pseudo ground voltage generation circuit provides a pseudo ground voltage level at the pseudo ground node, wherein a voltage difference between the first supply voltage level and the pseudo ground voltage level is smaller than a withstand voltage of the driver circuit;
   wherein, under the low-voltage operation, the variable supply voltage provides a second supply voltage level, so that the high level of the access signal corresponds to the second supply voltage level, and wherein, under the low-voltage operation, the pseudo ground voltage generation circuit electrically connects the pseudo ground node to a common ground voltage level.

2. The memory circuit of claim 1, wherein the memory unit performs the high-voltage operation according to a voltage difference between the first supply voltage level and the common ground voltage level.

3. The memory circuit of claim 1, wherein a voltage difference between the first supply voltage level and the common ground voltage level is greater than the withstand voltage.

4. The memory circuit of claim 1, wherein a voltage difference between the second supply voltage level and the common ground voltage level is smaller than the withstand voltage.

5. The memory circuit of claim 1, further comprising: a programming switch which is configured to, under the high-voltage operation, operably provide a programming ground voltage level to the memory unit, for performing the high-voltage operation.

6. The memory circuit of claim 1, wherein the memory circuit writes the data into the memory unit in the high-voltage operation.

7. The memory circuit of claim 1, wherein the driver circuit includes a pull-up switch, which is configured to operably conduct the variable supply voltage according to the driving signal, to provide the high level of the access signal.

8. The memory circuit of claim 1, wherein the driver circuit includes a pull-down switch, which is configured to operably conduct the pseudo ground node according to the driving signal, to provide the low level of the access signal.

9. The memory circuit of claim 1, wherein the level shifter is further coupled to the pseudo ground node, and wherein the level shifter generates the driving signal further according to a voltage level of the pseudo ground node.

10. The memory circuit of claim 1, wherein the pseudo ground voltage generation circuit includes:
   a reference voltage circuit, which is configured to operably provide the pseudo ground voltage level under the high-voltage operation; and
   a ground switch, which is configured to operably conduct the common ground voltage level to the pseudo ground node under the low-voltage operation, the ground switch being OFF under the high-voltage operation.

11. The memory circuit of claim 10, wherein the reference voltage circuit includes an amplifier circuit, which is configured to operably regulate the pseudo ground voltage level according to a difference between a reference signal and a pseudo-ground-related signal, wherein, the pseudo-ground-related signal is related to the pseudo ground voltage level.

12. The memory circuit of claim 10, wherein the reference voltage circuit includes at least one diode and a current source, for providing the pseudo ground voltage level, wherein the current source provides a direct current to the at least one diode, and wherein the pseudo ground voltage level is determined by a forward voltage of the at least one diode and/or a reverse breakdown voltage of the at least one diode.

13. The memory circuit of claim 1, wherein the memory unit includes a non-volatile memory device.

14. The memory circuit of claim 13, wherein the non-volatile memory device is a floating gate flash storage device or a one time programmable (OTP) storage device.

* * * * *